(12) United States Patent
Huang

(10) Patent No.: US 7,601,322 B2
(45) Date of Patent: Oct. 13, 2009

(54) METHOD FOR MAKING FIELD-EFFECT TRANSISTOR USING CARBON NANOTUBE

(75) Inventor: Houjin Huang, Kanagawa (JP)

(73) Assignee: Sony Corporation, Tokyo (JP)

( * ) Notice: Subject to any disclaimer, the term of this patent is extended or adjusted under 35 U.S.C. 154(b) by 699 days.

(21) Appl. No.: 11/186,298

(22) Filed: Jul. 20, 2005

(65) Prior Publication Data

US 2006/0286023 A1 Dec. 21, 2006

(30) Foreign Application Priority Data

Aug. 2, 2004 (JP) ............................ P2004-225834

(51) Int. Cl.
*D01F 9/12* (2006.01)
(52) U.S. Cl. ..................... 423/447.2; 257/20
(58) Field of Classification Search ................... 257/20; 423/447.2
See application file for complete search history.

(56) References Cited

U.S. PATENT DOCUMENTS 6,706,566 B2 * 3/2004 Avouris et al. .............. 438/132
6,798,000 B2 * 9/2004 Luyken et al. .............. 257/213

OTHER PUBLICATIONS

Tans, S.J. et al., "Room-temperature transistor based on a single carbon nanotube," Nature, May 1998, vol. 393, pp. 49-52.
Bachtold, A. et al., "Logic Circuits with Carbon Nanotube Transistors," Science, Nov. 2001, vol. 294, pp. 1317-1320.
Martel, R. et al., "Single- and multi-wall carbon nanotube field-effect transistors," Applied Physics Letters, Oct. 1998, vol. 73, No. 17, pp. 2447-2449.
Wind, S.J. et al., "Vertical scaling of carbon nanotube field-effect transistors using top gate electrodes," Applied Physics Letters, May 2002, vol. 80, No. 20, pp. 3817-3819.
Tseng, Y. et al., "Monolithic Integration of Carbon Nanotube Devices with Silicon MOS Technology," Nano Letters, 2004, vol. 1, No. 1, pp. 123-127.
Durkop, T. et al., "Extraordinary Mobility in Semiconducting Carbon Nanotubes," Nano Letters, 2004, vol. 4, No. 1, pp. 35-39.
Fan S. et al., "Self-Oriented Regular Arrays of Carbon Nanotubes and Their Field Emission Properties," Science, Jan. 1999, vol. 283, pp. 512-514.
Murakami Y. et al., "Growth of vertically aligned single-walled carbon nanotube films on quartz substrates and their optical anisotropy," Chemical Physics Letters, 2004, vol. 385, pp. 298-303.
Javey et al., "Carbon Nanotube Transistor Arrays for Multistage Complementary Logic and Ring Oscillators," Nano Letters, vol. 2, 2002, pp. 929-932.
Javey et al., "Ballistic carbon nanotube field-effect transistors," Nature, vol. 424, Aug. 2003, pp. 654-657.

* cited by examiner

*Primary Examiner*—Edward M Johnson
(74) *Attorney, Agent, or Firm*—K&L Gates LLP

(57) ABSTRACT

Carbon nanotube, method for positioning the same, field effect transistor made using the carbon nanotube, method for making the field-effect transistor, and a semiconductor device are provided. The carbon nanotube includes a bare carbon nanotube and a functional group introduced to at least one end of the bare carbon nanotube.

1 Claim, 6 Drawing Sheets

METHOD FOR MAKING FIELD-EFFECT TRANSISTOR USING CARBON NANOTUBE

CROSS REFERENCES TO RELATED APPLICATIONS

The present application claims priority to Japanese Patent Application JP 2004-225834, filed in the Japanese Patent Office on Aug. 2, 2004, the entire contents of which being incorporated herein by reference.

BACKGROUND

The present invention relates to a semiconducting carbon nanotube, a method for positioning the carbon nanotube, a field effect transistor (FET) made using the carbon nanotube, and a semiconductor device.

Ever since the year 1947 when a first semiconductor transistor was invented, the degree of integration of silicon microelectronics has grown substantially exponentially. Such growth, however, is not expected to continue in the near future. In particular, as the scale of integration approximates the nanometer order, the structure is reaching a physical limit of reliably achieving a desired function. With the increasing scale of integration, the cost of manufacture is also increasing exponentially, thereby inhibiting realization of higher integration.

As the technology that can overcome the limitation imposed by the principle of the silicon technology, the field of molecular electronics has drawn much attention. According to the molecular electronics, a monomolecular device can be fabricated at relatively low cost by self-alignment technology.

In the field of molecular electronics, molecular structures such as fullerenes and carbon nanotubes are increasingly attracting attentions. In particular, single-walled carbon nanotubes (SWNTs), which are rolled graphene sheets having diameters on the nanometer order, have been vigorously investigated as to their properties desirable in the field of electronics ever since their discovery in early 1990's.

SWNTs can show metallic or semiconducting electrical behavior depending on the angle and/or chirality of the spiral lattices of carbon molecules constituting the tube. The electrical performance of SWNTs is expected to surpass that of the best metal or semiconductor.

In 1998, a field-emission transistor (FET) incorporating a single SWNT was realized at room temperature (refer to Trans, S. J. et al., Nature, 1998, vol. 393, p. 49). An inverter, which is the simplest logical gate, was realized using a unipolar or complementary FET incorporating one or two carbon nanotubes. Other logical gates, such as NOR, AND, and static RAMs (SRAMs), were also fabricated using a complementary or multi-complementary mode. Ring oscillators realizing an oscillation frequency of 220 Hz were fabricated using arrays of p- or n-type carbon nanotube FETs (refer to Bachtold, A. et al., Science, 2001, vol. 294, p. 1317, and Derycke, V. et al., Nano Letters, 2002, vol. 2, p. 929).

Basic logical circuits incorporating transistors including SWNTs described above are mainly fabricated by two techniques. One is to disperse SWNTs in a solvent so that the carbon nanotubes can be positioned by scanning with an atomic force microscope (AFM) at the corresponding electrodes patterned in advance (refer to Trans, S. J. et al. and Bachtold, A. et al. above).

In this technique (first technique), SWNTs having a diameter of about 1 nm fabricated by laser abrasion are typically suspended in dichloroethane and this suspension is distributed on a wafer so that the SWNTs can be placed on gate electrodes using an AFM. Subsequently, selective deposition of Au is performed by lithography to form contact electrodes and leads on these nanotubes. According to an example of this technique disclosed in Martel, R. et al., Applied Physics Letters, 1998, vol. 73, p. 2447, a hole mobility of 20 $cm^2/(V \cdot s)$ is achieved in a back-gate structure.

Furthermore, a top-gate FET achieving a mutual conductance as high as 2,321 S/m by incorporating a carbon nanotube (CNT) as the gate electrode has been reported (Wind, S. J. et al., Applied Physics Letters, 2002, vol. 80, p. 38).

The other technique (second technique) is to directly deposit SWNTs by chemical vapor deposition (CVD) on electrode patterns formed in advance. Examples thereof are found in Javey, A. et al., Nature, 2003, vol. 424, p. 654 and in Tseng, Y. et al., Nano Letters, 2004, vol. 1, p. 123.

Transistors fabricated by this technique exhibit a mutual conductance as high as 6,000 S/m and a carrier mobility as high as 3,000 $cm^2/(V \cdot s)$, which are important properties for transistors. These values are one digit larger than those of silicon semiconductors.

In particular, a transistor prepared by this technique achieves a carrier mobility as high as 79,000 $cm^2/(V \cdot s)$ by incorporating a semiconductor CNT 300 μm in length, as reported in Durkop, T. et al., Nano Letters, 2004, vol. 4, p. 35.

The first technique that uses an AFM is hardly practicable since it concerns manual placement of a large number of CNTs on devices. Its application to semiconductor devices, such as memories of central processing unit (CPU) chips, is difficult.

The second technique that employs CVD is a high-temperature process. Thus, accurate positioning of CNTs on a large number of electrodes is difficult. The second technique is rarely suitable for integrated circuit applications. In fact, an actual case of mounting SWNTs onto part of a silicon metal oxide semiconductor (MOS) by CVD reported low alignment accuracy, i.e., that only 1% of about 2,000 CNTs functioned as back gates (refer to Tseng, Y. et al., Nano Letters, 2004, vol. 4, p. 123).

SUMMARY

The present invention is directed to a carbon nanotube that can be highly accurately positioned at a predetermined location in making an integrated circuit having FETs including carbon nanotubes. The present invention is also directed to a method for positioning the carbon nanotube, a FET made using the carbon nanotube, a method for making the FET, and a semiconductor device.

An embodiment of the carbon nanotube of the present invention includes a bare carbon nanotube and a functional group introduced to at least one end of the bare carbon nanotube. With this structure, at least one end can be selectively bonded or attached to a particular material.

The functional group may be introduced at both ends of the bare carbon tube so that both ends can be selectively bonded or attached to particular materials.

The functional group introduced to one end may be different from the functional group introduced to the other end. Preferably, the functional groups selectively interact with predetermined conductive materials. In this manner, the ends can be selectively bonded or attached to a plurality of materials.

Another embodiment is a method for positioning a carbon nanotube. The method includes forming a carbon nanotube thin film including semiconducting bare carbon nanotubes densely aligned on a first substrate in a direction intersecting the longitudinal direction of the carbon nanotubes; introducing a first functional group to a first end of each of the bare carbon nanotubes constituting the carbon nanotube thin film; attaching a second substrate onto the side of the carbon nanotube thin film opposite to the first substrate; removing the first substrate and introducing a second functional group to a second end of each of the bare carbon nanotubes; placing the carbon nanotube thin film in a solvent to disperse the carbon nanotubes having the first and second functional groups so as to prepare a dispersion; and applying the dispersion onto electrodes composed of conductive materials that selectively interact with the first and second functional groups, the electrodes being formed in advance by patterning, so as to position the respective carbon nanotubes across the electrodes.

According to this method, carbon nanotubes can be easily positioned at target locations without complicated procedures using expensive equipment or without high-temperature processes.

Yet another embodiment is a field-effect transistor that includes source and drain electrodes and a gate in which current is controlled by varying the conductivity of a channel functioning as a current path between the source and drain electrodes. At least the material of the channel is a semiconducting carbon nanotube. Since the carbon nanotube is used as the channel, a FET having excellent properties can be produced.

Still another embodiment is a method for making a field-effect transistor having source and drain electrodes and a gate in which current is controlled by varying the conductivity of a channel functioning as a current path between the source and drain electrodes. The method includes forming a carbon nanotube thin film including semiconducting bare carbon nanotubes densely aligned on a first substrate in a direction intersecting the longitudinal direction of the carbon nanotubes; introducing a first functional group to a first end of each of the bare carbon nanotubes constituting the carbon nanotube thin film; attaching a second substrate onto the side of the carbon nanotube thin film opposite to the first substrate; removing the first substrate and introducing a second functional group to a second end of each of the bare carbon nanotubes; placing the carbon nanotube thin film in a solvent to disperse the carbon nanotubes having the first and second functional groups so as to prepare a dispersion; and applying the dispersion onto the source and drain electrodes composed of conductive materials that selectively interact with the first and second functional groups, the source and drain electrodes being formed in advance by patterning, so as to position the respective carbon nanotubes across the source and drain electrodes.

According to this method, the carbon nanotubes can be easily and accurately positioned on the source and drain electrodes and the productivity can be increased.

Another embodiment is a semiconductor device including a semiconducting carbon nanotube, a first region to which one end of the carbon nanotube is fixed, and a second region to which the other end of the carbon nanotube is fixed. The material of the first region is different from the material of the second region. The semiconductor device simplifies the positioning of the carbon nanotubes having excellent semiconducting properties.

Additional features and advantages are described herein, and will be apparent from, the following Detailed Description and the figures.

DETAILED DESCRIPTION

The present invention relates to a semiconducting carbon nanotube, a method for positioning the carbon nanotube, a field effect transistor (FET) made using the carbon nanotube, and a semiconductor device.

Preferred embodiments of the present invention will now be described without limitation to the scope of the invention.

Figure 1:
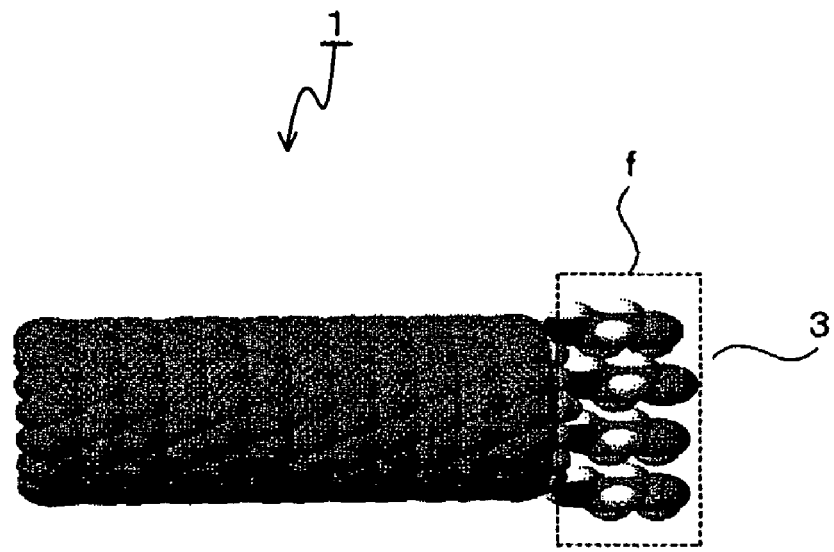
FIG. 1 is a schematic diagram of an example of a carbon nanotube.

An example structure of a carbon nanotube is shown in the schematic diagram of FIG. 1. A CNT 1 has a functional group in one end of the bare carbon nanotube. In particular, the CNT 1 includes a functional group 3 bonded to a first end of the bare CNT by chemical interaction. Examples of the functional group 3 include —COOH, —C=O, and —NH$_2$.

Figure 2:
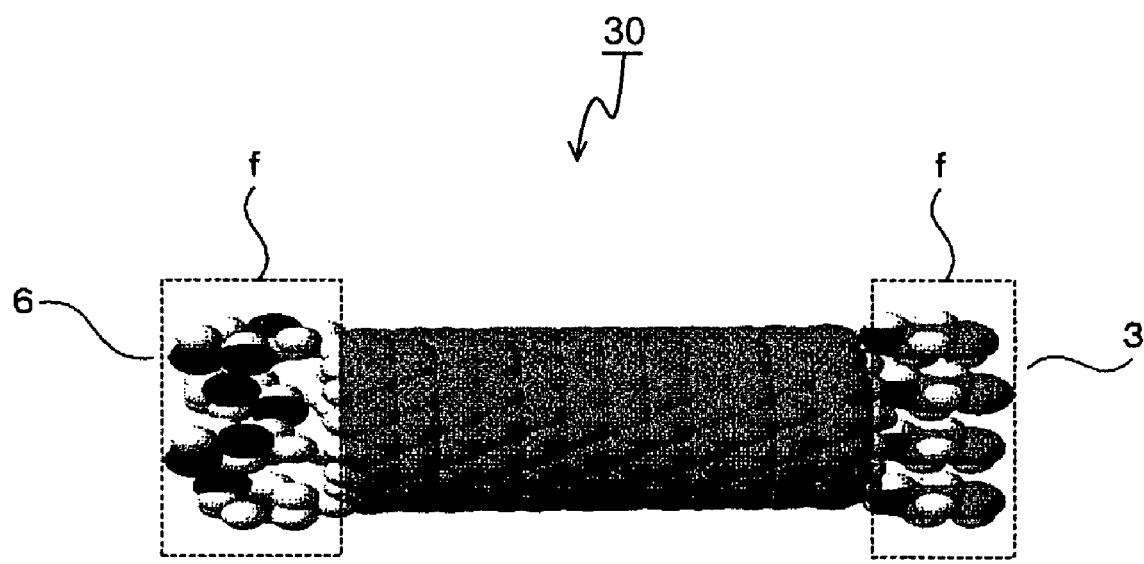
FIG. 2 is a schematic diagram of another example of a carbon nanotube.

Another example of a carbon nanotube is shown in FIG. 2. In a carbon nanotube 30, the functional group 3 is bonded to the first end of the bare PCT and a different functional group 6 is bonded to the other end (second end) of the bare CNT.

The CNT 1 or 30 may be a single-walled carbon nanotube (SWNT) or a multi-walled carbon nanotube (MWNT). The diameter of the CNT may be about 0.4 nm to about 100 nm, and the length of the CNT may be about 2 nm to about 1 mm. Examples of the functional groups 3 and 6 include various functional groups containing elements of Groups I, II, and XIII to XVI in the periodic table.

Examples of the method of making the CNT, the method of positioning the CNT at a predetermined location, and the method of making a FET using the CNT will now be described with reference to FIGS. 3 to 13. Each method includes the following:

forming, on a first substrate, a carbon nanotube thin film composed of bare carbon nanotubes densely aligned in a direction intersecting the longitudinal direction of the bare carbon nanotubes;

introducing a predetermined functional group into a first end of each bare carbon nanotube;

attaching a second substrate to the side of the carbon nanotube thin film opposite to the first substrate and then removing the first substrate;

introducing another functional group into a second end of each carbon nanotube to prepare a functionalized carbon nanotube;

separating the carbon nanotube thin film from the second substrate and dispersing the functionalized carbon nanotubes in a solvent; and positioning each functionalized carbon nanotube between two electrodes formed by self-alignment, the two electrodes being formed on a third substrate in advance.

In the carbon nanotube thin film, the bare carbon nanotubes are aligned on the first substrate using radiofrequency (RF) plasma or the like (e.g., refer to Fan S. et al., Science, 1999, vol. 283, p. 512 and Murakami Y. et al., Chemical Physics Letters, 2004, vol. 385, p. 298), for example.

In this embodiment, the first substrate (a substrate 2 in FIG. 3) may be composed of glass, quartz, silicon, or the like. Any other materials that can withstand high temperature for depositing carbon nanotubes may also be used. In forming SWNTs, the first substrate is preferably composed of a material that does not react with the catalyst used for deposition at high temperature.

Figure 3:
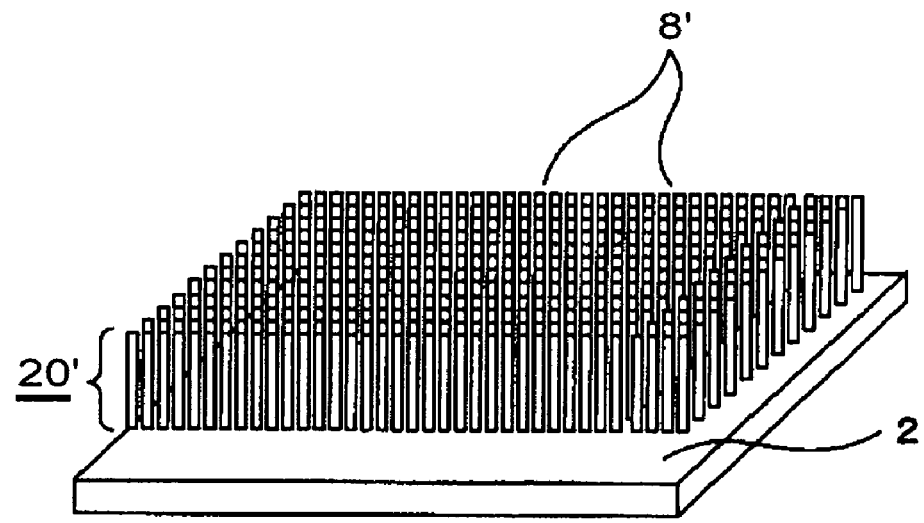
FIG. 3 shows a method for positioning carbon nanotubes and method for making a FET accordingly to an embodiment of the present invention.

As shown in FIG. 3, in this embodiment, SWNTs can be densely formed on the substrate 2, which is composed of glass or the like, using RF plasma such that the SWNTs extend in a substantially perpendicular direction with respect to the surface of the substrate 2. In particular, a carbon nanotube thin film (CNT thin film) 20' is composed of arrays of bare carbon nanotubes 8' with spacing substantially equal to or less than the diameter of the carbon nanotube in a direction intersecting the longitudinal direction of the carbon nanotubes. By using the RF plasma, arrays of bare SWNTs can be formed, and the percentage of the SWNTs exhibiting the semiconducting behavior in all the SWNTs formed can be increased.

The bare carbon nanotubes 8' may be aligned substantially perpendicular to the surface of the substrate, as shown in FIG. 3 or may be aligned with a particular angle while maintaining the spacing between the carbon nanotubes substantially the same. Even when the CNTs 8' are inclined with a particular angle, the functional group can still be introduced to the ends of the CNTs 8'.

Next, a functional group 3, such as —COOH, —C=O, —NH$_2$, or the like, is introduced to a first end, i.e., the end not attached to the substrate 2, of each CNT 8'.

Examples of the method for introducing the functional group to the first end of each bare CNT include chemical methods and electrochemical methods that use solvents and plasma.

In order to introduce a —COOH group or the like as the functional group 3, the carbon nanotube thin film 20' may be immersed in an acidic solution and then oxidized by application of positive voltage, for example.

The solution here contains a chemical substance, such as an acid, an alkali, or an oxide. For example, the acidic substance may be nitric acid, sulfuric acid, or a combination of these. The alkaline substance may be NaOH, KOH, or a combination of these. The oxide may be $H_2O_2$, a bromide, or a combination of these.

In order to introduce a functional group such as —C=O, plasma treatment in an oxide atmosphere may be employed. In order to introduce a functional group such as —NH$_2$, RF plasma treatment in a NH$_3$ atmosphere may be employed.

Next, a flat second substrate 4 composed of glass, quartz, silicon, or the like is attached to the other side of the carbon nanotube thin film 20". In order to efficiently attach the second substrate 4 onto the carbon nanotube thin film 20", an adhesive layer 5 that can adhere onto the functionalized ends of the carbon nanotubes is formed on the surface of the second substrate 4 in advance. The adhesive layer 5 may be composed of a material, such as an adhesive polymer film, that has adhesiveness and that can be easily removed in the subsequent process. Alternatively, the adhesive layer 5 may be composed of a material that can physically attach to the functionalized ends of the carbon nanotubes by electrostatic interaction.

It is preferable to avoid chemical interaction between the functional groups 3 and the adhesive layer 5 in order that the functional groups 3 introduced to the ends of the carbon nanotubes are prevented from being modified. That the functional groups 3 maintain their properties is desirable for achieving selective bonding of the functional groups 3 to a particular electrode material and for the self alignment of the carbon nanotubes performed in subsequent process stages. It is possible to use chemical reaction, such as acid-alkali reaction, as long as the reaction does not modify the properties of the functional group 3 of reacting to the particular material.

Figure 6:
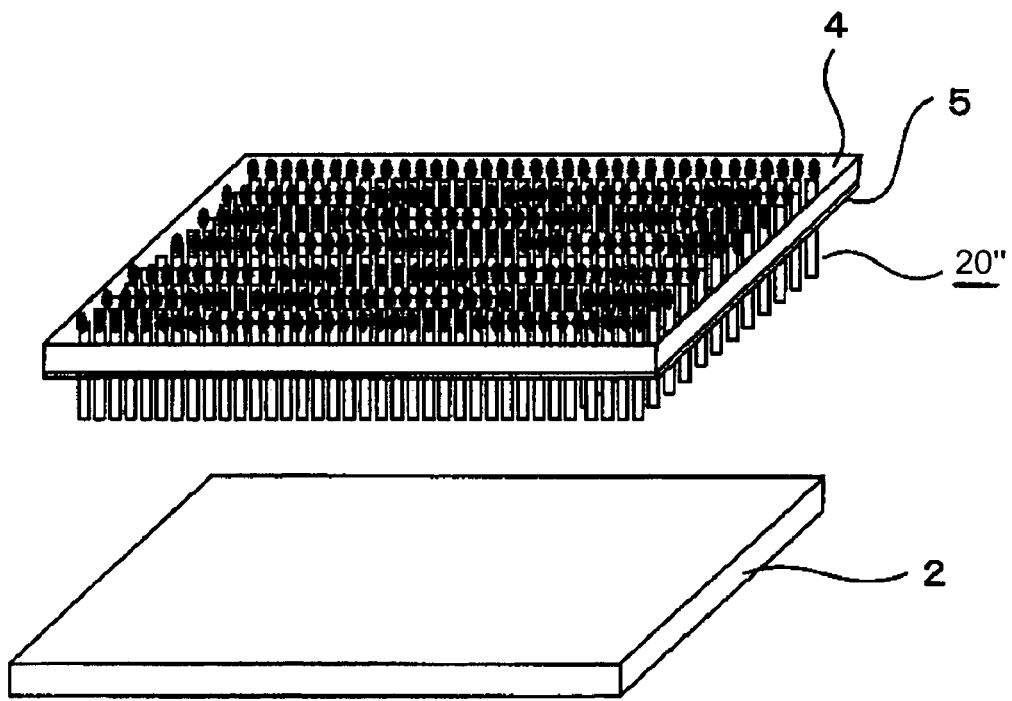
FIG. 6 shows a method for positioning carbon nanotubes and method for making a FET according to another embodiment of the present invention.

Subsequently, as shown in FIG. 6, the carbon nanotube thin film 20 is separated from the first substrate 2.

Figure 7:
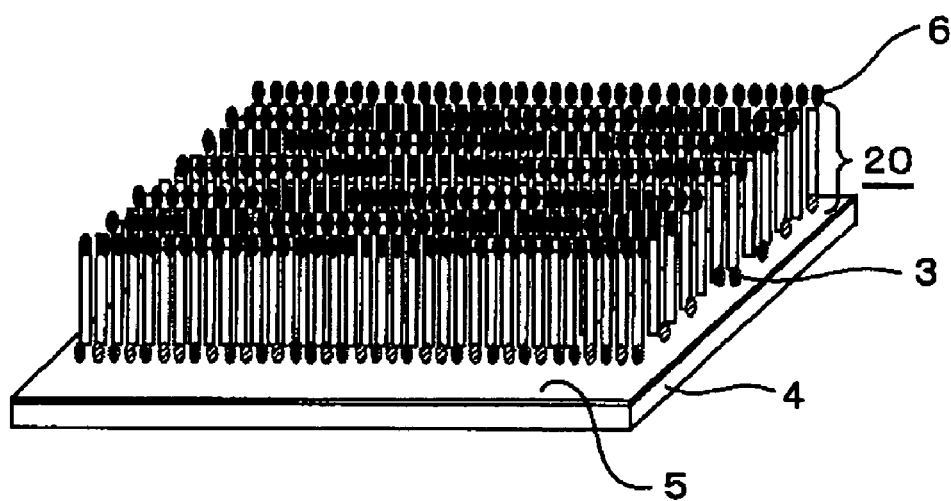
FIG. 7 shows a method for positioning carbon nanotubes and method for making a FET according to another embodiment of the present invention.

In introducing another functional group, as shown in FIG. 7, functional groups 6 are introduced to the second ends of the carbon nanotubes of the carbon nanotube thin film 20. The functional groups 6 may be introduced by the same process described in FIG. 4.

Figure 4:
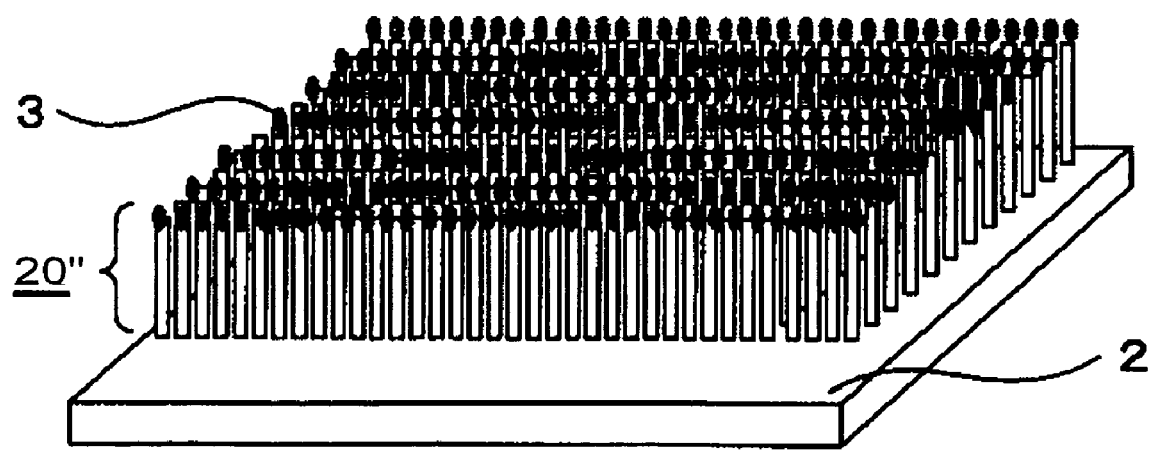
FIG. 4 shows a method for positioning carbon nanotubes and method for making a FET according to another embodiment of the present invention.
Figure 5:
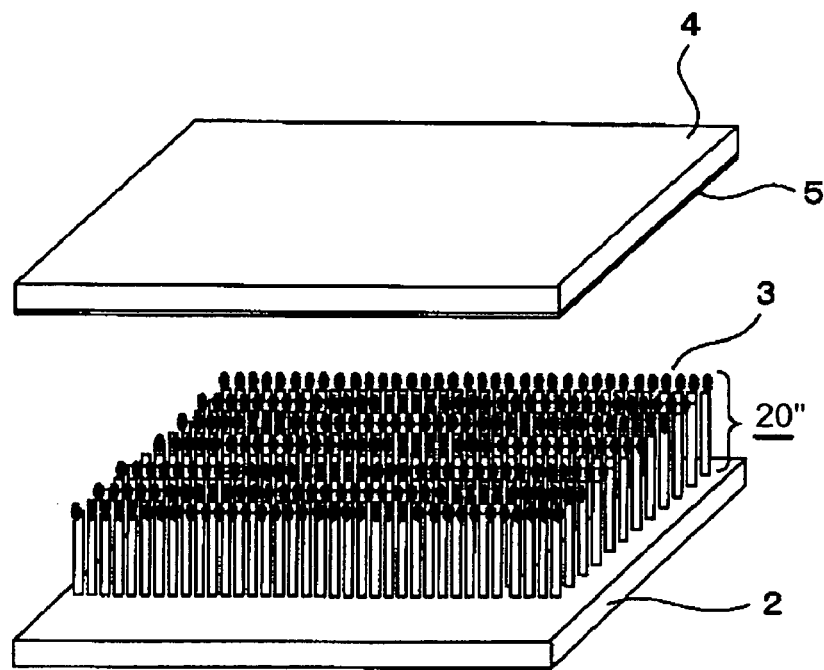
FIG. 5 shows a method for positioning carbon nanotubes method for making a FET according to another embodiment of the present invention.

The functional groups 6 are preferably different from the functional groups 3 described with reference to FIG. 4. This is desirable to allow the functional groups 6 to selectively react with an electrode material different from the electrode material to which the functional groups 3 selectively react, so that the carbon nanotubes can be self-aligned.

Figure 8:
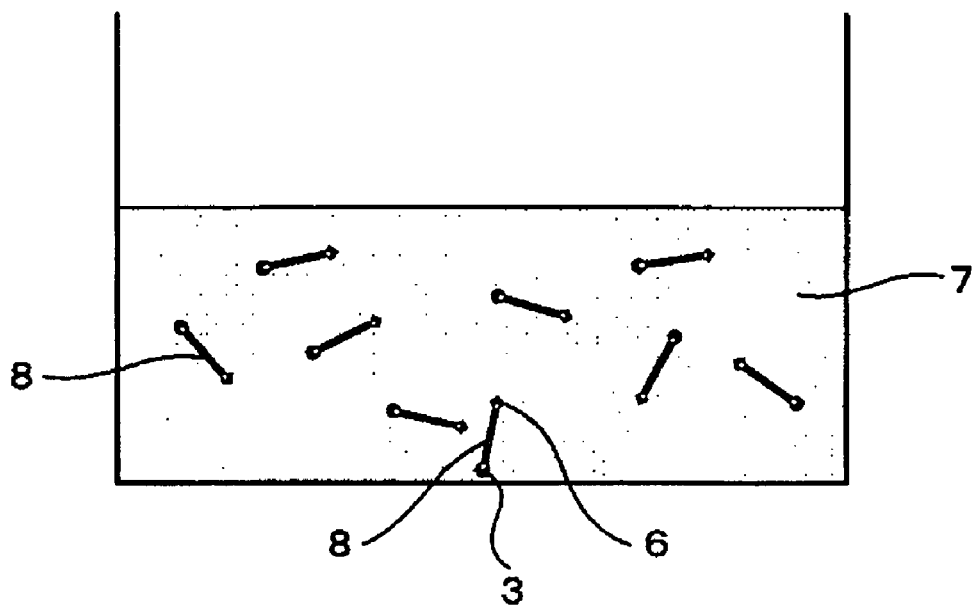
FIG. 8 shows a method for positioning carbon nanotubes and method for making a FET according to another embodiment of the present invention.

Next, as shown in FIG. 8, the carbon nanotube thin film 20 is separated from the second substrate 4 and placed in a solvent 7 to disperse functionalized CNTs 8. Examples of the solvent 7 include dichloroethane (DCE), dimethylformamide (DMF), and tetrahydrofuran (THF).

The solvent 7 preferably contains as little contaminants as possible. Contamination can be prevented by ultrasonic wave treatment. For example, the adhesive layer 5 can be sufficiently prevented from entering the solvent 7 by adequately selecting the power and duration of ultrasonic wave treatment.

Figure 9:
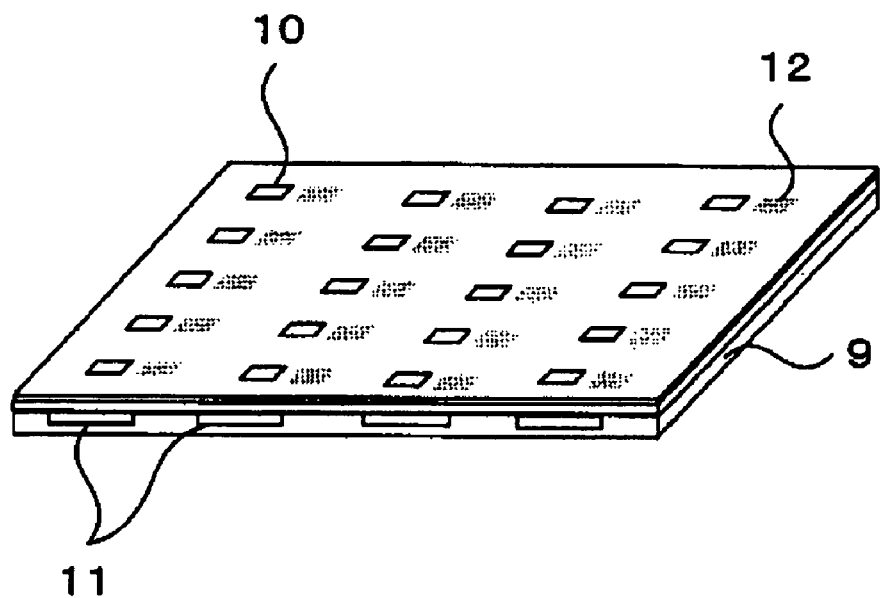
FIG. 9 shows a method for making a FET according to another embodiment of the present invention.

Referring now to FIG. 9, electrodes 10 and 12 for forming source and drain electrodes of transistors are formed by a typical semiconductor production process, such as lithography, on a substrate 9 for forming a semiconductor device including FETs. The substrate 9 is composed of silicon. In the drawing, the gate structures 11, such as source/drain regions, in the substrate are schematically shown. Predetermined interconnections are also formed but are not depicted in the drawing.

Figure 10:
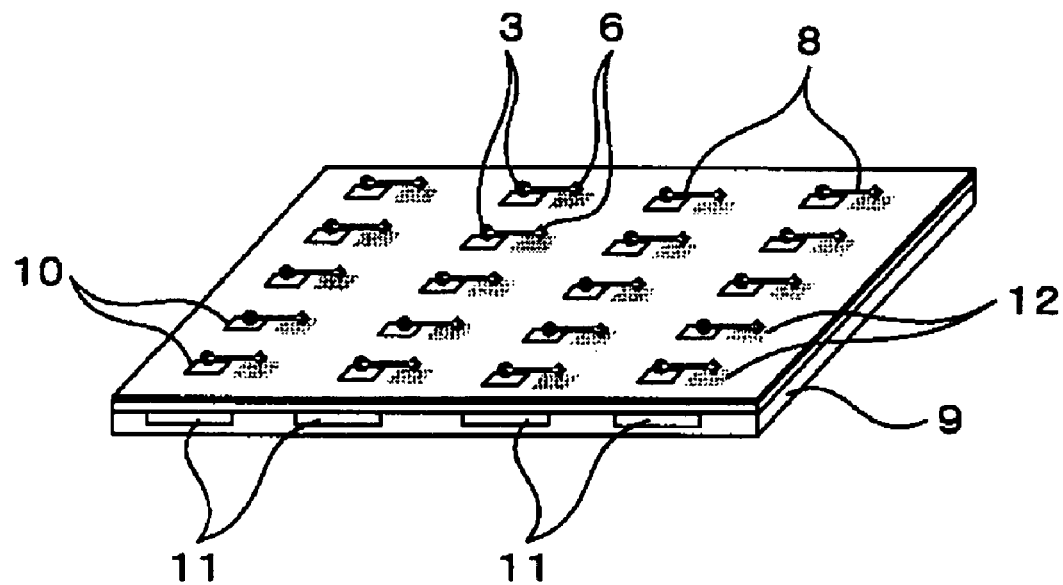
FIG. 10 shows a method for making a FET according to another embodiment of the present invention.

Next, the solvent 7 containing dispersed carbon nanotubes 8 is applied on the electrodes 10 and 12 by dipping, spin-coating, or the like, as shown in FIG. 10.

The electrodes 10 are composed of a material that selectively interacts with one of the functional group 3 and the functional group 6 at the ends of the carbon nanotubes 8, whereas the electrodes 12 are composed of a material that selectively interacts with the other one of the functional group 3 and the functional group 6. The possible combinations of the electrode material and the functional group are provided in Table 1. Note that the interaction between the electrode material and the functional group of each combination is achieved by physical bonding resulting from interatomic force, electronic transition bonding, chemical bonding, or the like.

TABLE 1

| Functional group | Electrode material |
| --- | --- |
| —SH | Au, Pt, Ag, Pd, Cu |
| —S—S— | Au, Pt, Ag, Pd, Cu |
| —COOH | Al, Fe, Co, Ni, Zn |
| —SO$_3$H | Al, Fe, Co, Ni, Zn |
| —OH | Pt |

In this manner, the functional groups 3 and 6 at the ends of the CNTs 8 selectively bond with the electrodes 10 and 12, as shown in FIG. 10, and the CNTs 8 are self-aligned. The process does not involve a complicated procedure such as using an AFM or a high-temperature process such as one accompanying the CVD but can position carbon nanotubes on predetermined electrodes with high accuracy.

The electrodes may be composed of an element of Groups III to XIII in the periodic table. A chemical substance including H, C, N, OP, S, or the like may cover or introduced to the conductive material of the electrodes so that the connection between the functional groups at the ends of the carbon nanotubes and electrodes can be strengthened.

Alternatively, the chemical substance may be added to the solvent 7 for dispersing the carbon nanotubes 8 to achieve the same effect.

For example, the group —SH of aminoethanethiol (NH$_2$CH$_2$CH$_2$SH) may be bonded to a Au electrode material and NH$_2$ may be reacted with —COOH introduced at the ends of the carbon nanotube 8 so that the electrode can be more securely connected to the carbon nanotube.

As is evident from the above, the range of usable material that can yield interaction between the carbon nanotubes and the electrodes can be widened by combining various chemical substances reactive to particular materials with the electrode material. The speed of interaction and selectivity can be further increased.

Figure 11:
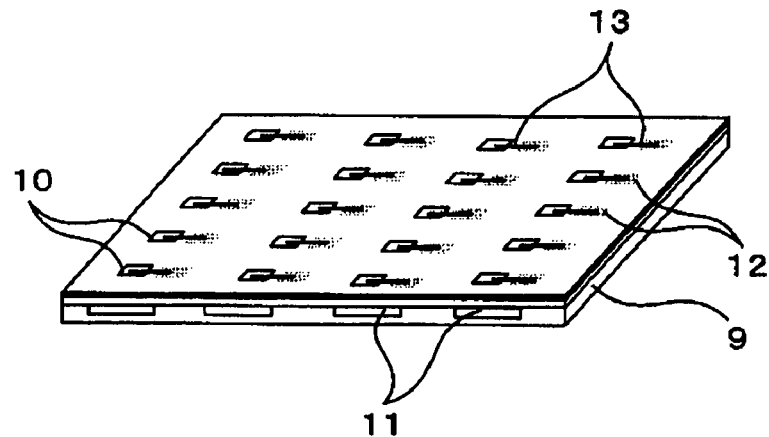
FIG. 11 shows a method for making a FET according to another embodiment of the present invention.

The CNTs 8 self-aligned on the electrodes 10 and 12 may be annealed at a temperature in the range of 200° C. to 2,000° C. to substantially remove the materials other than carbon. Thus, as shown in FIG. 11, carbon nanotubes 13 without functional groups at the ends can be disposed on the electrodes 10 and 12, and the contact resistance between the carbon nanotubes 13 and the electrodes 10 and 12 can thereby be reduced.

In this annealing process, the functional groups start to separate from the carbon nanotubes 8 at about 200° C., and almost all functional groups completely separate from the carbon nanotubes 8 at about 400° C. to about 500° C. The maximum annealing temperature is preferably 2,000° C. or less to prevent damage on the carbon nanotubes and the substrates and to avoid high-temperature processing. More preferably, the maximum annealing temperature is 800° C. or less. Annealing at 100° C. to 500° C. is a low-temperature process compared with deposition of CNTs by CVD.

The annealing process is preferably conducted by introducing He or Ar gas while maintaining a predetermined degree of vacuum.

Figure 12:
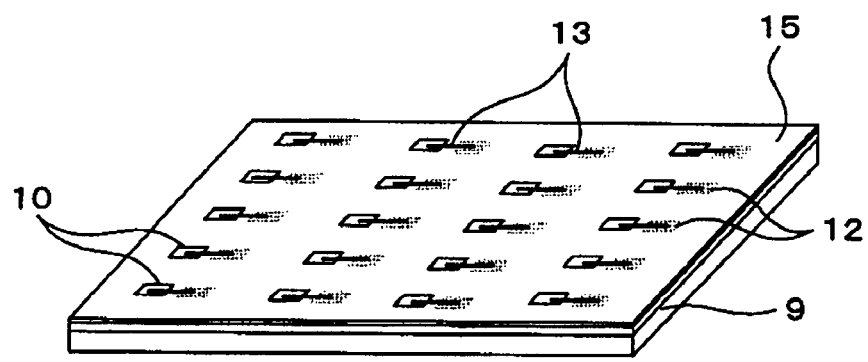
FIG. 12 shows a method for making a FET according to another embodiment of the present invention.

Subsequently, as shown in FIG. 12, a cover layer 15 composed of a dielectric material is disposed on the carbon nanotubes 13 and the electrodes 10 and 12. The cover layer 15 may be composed of a material having a dielectric constant of 2.0 or more so that generation of leak current can be securely prevented and the gate effect is not affected. The thickness of the cover layer 15 is preferably 1 nm to 1,000 nm.

Figure 13:
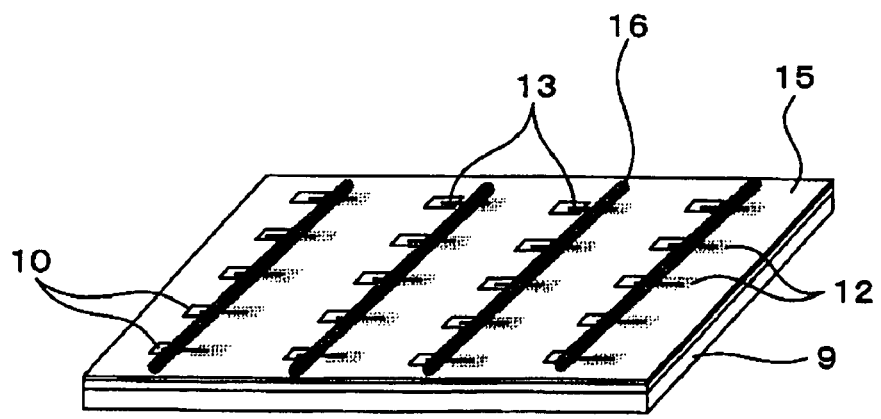
FIG. 13 shows a method for making a FET according to another embodiment of the present invention.

As shown in FIG. 13, gate electrodes 16 are formed to obtain FETs that exhibit desirable properties by having the channel structure constituted from the carbon nanotubes 13.

The FETs thus prepared exhibit superior properties compared to known transistors composed of silicon materials in terms of mutual conductance and carrier mobility since the FETs include channels constituted from the carbon nanotubes 13 having semiconducting behavior.

According to the carbon nanotube and the method for positioning the carbon nanotube described above, carbon nanotubes having excellent semiconducting properties can be accurately positioned at predetermined locations by self alignment without complicated procedures or high temperature processes. By making FETs using the carbon nanotubes, the productivity of FETs having excellent properties can be increased.

Moreover, the method of positioning the carbon nanotube described above can facilitate production of various semiconductor devices each including a carbon nanotube, a first region to which one end of the carbon nanotube is fixed, and a second region to which the other end of the carbon nanotube is fixed, the first and second regions being composed of different materials, without expensive equipment or high-temperature processes.

Examples of such semiconductor devices include switching elements of various displays, next-generation logic devices, and optoelectronic memory devices.

It should be understood by those skilled in the art that the present invention is not limited to the materials and structures described in the embodiments above. Various modifications, combinations, and alterations may occur depending on design requirements and other factors insofar as they are within the scope of the appended claims or the equivalents thereof. For example, MWNTs may be used as the CNTs or the method of positioning may be applied to making of various other semiconductor devices.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method for making a field-effect transistor having source and drain electrodes and a gate in which current is controlled by varying conductivity of a channel functioning as a current path between the source and drain electrodes, the method comprising:
    forming a carbon nanotube thin film including semiconducting bare carbon nanotubes densely aligned on a first substrate in a direction intersecting a longitudinal direction of the carbon nanotubes;
    introducing a first functional group to a first end of each of the bare carbon nanotubes constituting the carbon nanotube thin film;
    attaching a second substrate onto a side of the carbon nanotube thin film opposite to the first substrate;
    removing the first substrate and introducing a second functional group to a second end of each of the bare carbon nanotubes;
    separating the carbon nanotube thin film from the second substrate and placing the carbon nanotube thin film in a solvent to disperse the carbon nanotubes having the first and second functional groups so as to prepare a dispersion; and applying the dispersion onto the source and drain electrodes composed of conductive materials that selectively interact with the first and second functional groups, the source and drain electrodes being formed in advance by patterning, so as to position the respective carbon nanotubes across the source and drain electrodes.

* * * * *